United States Patent
Kugler et al.

(10) Patent No.: US 9,804,500 B2
(45) Date of Patent: Oct. 31, 2017

(54) OPTICAL IMAGING ARRANGEMENT WITH SIMPLIFIED MANUFACTURE

(71) Applicant: Carl Zeiss SMT GmbH, Oberkcohen (DE)

(72) Inventors: Jens Kugler, Aalen (DE); Stefan Xalter, Oberkochen (DE); Jens Prochnau, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 9 days.

(21) Appl. No.: 15/057,491

(22) Filed: Mar. 1, 2016

(65) Prior Publication Data

US 2016/0179013 A1 Jun. 23, 2016

Related U.S. Application Data

(63) Continuation of application No. PCT/EP2013/070372, filed on Sep. 30, 2013.

(51) Int. Cl.
*G03B 27/54* (2006.01)
*G03F 7/20* (2006.01)
*G02B 7/182* (2006.01)

(52) U.S. Cl.
CPC ........... *G03F 7/7015* (2013.01); *G02B 7/182* (2013.01); *G03F 7/70825* (2013.01); *G03F 7/70975* (2013.01)

(58) Field of Classification Search
CPC . G03F 7/7015; G03F 7/70833; G03F 7/70975

(Continued)

(56) References Cited

U.S. PATENT DOCUMENTS 7,433,050 B2 * 10/2008 Sakamoto ........... G03F 7/70341
355/53
7,483,118 B2 * 1/2009 Mulkens ............. G03F 7/70258
355/30

(Continued)

FOREIGN PATENT DOCUMENTS

CN 101248392 8/2008
CN 102549503 7/2012

(Continued)

OTHER PUBLICATIONS

International Search Report and Written Opinion for corresponding PCT Appl No. PCT/EP2013/070372, dated Jul. 21, 2014.

(Continued)

*Primary Examiner* — Hung Henry Nguyen
(74) *Attorney, Agent, or Firm* — Fish & Richardson P.C.

(57) ABSTRACT

An optical imaging apparatus includes an optical element support sub-structure and an auxiliary support sub-structure. The optical element support sub-structure is configured to support an optical element and has a first temporary support interface arrangement. The optical element is configured to form part of a group of optical elements of the optical imaging apparatus configured to transfer, in an exposure process using exposure light, an image of a pattern of a mask onto a substrate. The auxiliary support sub-structure is configured to support an auxiliary component and has a second temporary support interface arrangement. The auxiliary component is configured to execute, during the exposure process, an auxiliary function of the exposure process other than transferring the image of the pattern onto the substrate.

20 Claims, 5 Drawing Sheets

(58) Field of Classification Search
USPC .......................................... 355/30, 52, 55, 67
See application file for complete search history.

(56) References Cited

U.S. PATENT DOCUMENTS

| | | |
|---|---|---|
| 2008/0212083 A1 | 9/2008 | Kwan |
| 2010/0110397 A1 | 5/2010 | Phillips |
| 2010/0200777 A1 | 8/2010 | Hauf et al. |
| 2011/0176234 A1 | 7/2011 | Soemers et al. |
| 2012/0188523 A1 | 7/2012 | Kulitsky et al. |
| 2014/0185029 A1* | 7/2014 | Kwan ................. G03F 7/70825 355/72 |

FOREIGN PATENT DOCUMENTS

| | | |
|---|---|---|
| CN | 103299249 | 9/2013 |
| JP | 2010-080754 | 4/2010 |

OTHER PUBLICATIONS

International Preliminary Report on Patentability for corresponding PCT Appl No. PCT/EP2013/070372, dated Apr. 5, 2016.
Chinese Office Action with translation thereof for CN Appln. No. 20201380079975.1, dated Apr. 14, 2017,13 pages.
Beitz, Kuttner, & Davies, DUBBEL—Handbook of Mechanical Engineering, p. F28, section 1.5, (1994).

* cited by examiner

OPTICAL IMAGING ARRANGEMENT WITH SIMPLIFIED MANUFACTURE

CROSS-REFERENCE TO RELATED APPLICATION

The present application is a continuation of, and claims benefit under 35 USC 120 to, international application PCT/EP2013/070372, filed Sep. 30, 2013. The entire disclosure of international application PCT/EP2013/070372 is incorporated by reference herein.

FIELD

The disclosure relates to an optical imaging apparatus module used in exposure processes, in particular to an optical imaging apparatus module for microlithography systems. It further relates to a method of supporting components of an optical module for use in an optical imaging apparatus. The disclosure may be used in the context of manufacturing and using an optical imaging apparatus for photolithography processes for fabricating microelectronic devices, in particular semiconductor devices, or in the context of fabricating devices, such as masks or reticles, used during such photolithography processes.

BACKGROUND

Typically, the optical systems used in the context of fabricating microelectronic devices such as semiconductor devices include a plurality of optical modules including optical elements, such as lenses and mirrors etc., arranged in the light path of the optical system. Those optical elements, as a primary function of an exposure process, cooperate to transfer an image of a pattern formed on a mask, reticle or the like onto a substrate such as a wafer. The optical elements are usually combined in one or more functionally distinct optical element groups. These distinct optical element groups may be held by distinct optical exposure units. In particular with mainly refractive systems, such optical exposure units are often built from a stack of optical element modules holding one or more optical elements. These optical element modules usually include an external generally ring shaped support device supporting one or more optical element holders each, in turn, holding an optical element.

Due to the ongoing miniaturization of semiconductor devices there is a desire for enhanced resolution of the optical systems used for fabricating those semiconductor devices. This desire for enhanced resolution tends to push the desire for an increased numerical aperture (NA) and increased imaging accuracy of the optical system.

One approach to achieve enhanced resolution is to reduce the wavelength of the light used in the exposure process. In the recent years, approaches have been made to use light in the extreme ultraviolet (EUV) range using wavelengths ranging from 5 nm to 20 nm, typically about 13 nm. In this EUV range it is not possible to use common refractive optics any more. This is due to the fact that, in this EUV range, the materials commonly used for refractive optical elements show a degree of absorption that is too high for obtaining high quality exposure results on a commercially acceptable scale. Thus, in the EUV range, reflective systems including reflective elements such as mirrors or the like are used in the exposure process to transfer the image of the pattern formed on the mask onto the substrate, e.g. the wafer.

The transition to the use of high numerical aperture (e.g. NA>0.4 to 0.5) reflective systems in the EUV range leads to considerable challenges with respect to the design of the optical imaging arrangement.

One of the accuracy properties is the accuracy of the position of the image on the substrate, which is also referred to as the line of sight (LoS) accuracy. The line of sight accuracy typically scales to approximately the inverse of the numerical aperture. Hence, the line of sight accuracy is a factor of 1.4 smaller for an optical imaging arrangement with a numerical aperture NA=0.45 than that of an optical imaging arrangement with a numerical aperture of NA=0.33. Typically, the line of sight accuracy ranges below 0.5 nm for a numerical aperture of NA=0.45. If double patterning is also to be allowed for in the exposure process, then the accuracy would typically have to be reduced by a further factor of 1.4. Hence, in this case, the line of sight accuracy would range even below 0.3 nm.

Among others, the above leads to very strict desired properties with respect to the relative position between the components participating in the exposure process. Furthermore, to reliably obtain high-quality semiconductor devices it is not only desirable to provide an optical system showing a high degree of imaging accuracy. It is also desirable to maintain such a high degree of accuracy throughout the entire exposure process and over the lifetime of the system. As a consequence, the optical imaging arrangement components, i.e. the mask, the optical elements and the wafer, for example, cooperating in the exposure process is supported in a defined manner in order to maintain a predetermined spatial relationship between the optical imaging arrangement components to provide a high quality exposure process.

To maintain the predetermined spatial relationship throughout the entire exposure process, even under the influence of vibrations (introduced, among others, via the ground structure supporting the arrangement and/or via internal sources of vibration disturbances, such as accelerated masses, e.g. moving components, turbulent fluid streams, etc.) as well as under the influence of thermally induced position alterations, it is desirable to at least intermittently capture the spatial relationship between certain components of the optical imaging arrangement in an auxiliary process and to adjust the position of at least one of the components of the optical imaging arrangement as a function of the result of this auxiliary capturing process.

Typically, this auxiliary capturing process is done via auxiliary components of a metrology system using a central support structure for the optical projection system and the substrate system as a common reference in order to be able to readily synchronize motion of the actively adjusted parts of the imaging arrangement.

On the other hand, an increase in the numerical aperture, typically, leads to an increased size of the optical elements used, also referred to as the optical footprint of the optical elements. The increased optical footprint of the optical elements used has a negative impact on their dynamic properties and the control system used to achieve the above adjustments. Furthermore, the increased optical footprint typically leads to larger light ray incidence angles. However, at such increased light ray incidence angles transmissivity of the multi-layer coatings typically used for generating the reflective surface of the optical elements is drastically reduced, obviously leading to an undesired loss in light power and an increased heating of the optical elements due to absorption. As a consequence, even larger optical elements have to be used in order to enable such imaging at a commercially acceptable scale. These circumstances lead to optical imaging arrangements with comparatively large optical elements having an optical footprint of up to 1 m×1 m and which are arranged very close to each other with mutual distances ranging down to less than 60 mm.

Several problems result from this situation. First, irrespective of the so-called aspect ratio (i.e. the thickness to diameter ratio) of the optical element, a large optical element generally exhibits low resonant frequencies making it more susceptible to vibration disturbances typically experienced in the environment of such an optical imaging apparatus. While, for example, a mirror with an optical footprint of 150 mm (in diameter) and a thickness of 25 mm typically has resonant frequencies above 4000 Hz, a mirror with an optical footprint of 700 mm, typically, hardly reach resonant frequencies above 1500 Hz even at a thickness of 200 mm.

Furthermore, the increased thermal load on the optical elements used (due to light energy absorption) and the increased throughput desired for such systems involves increased cooling efforts via further auxiliary components such as coolers and, in particular, higher flow rates of the cooling fluids used. This increased cooling flow rate is prone to lead to an increase in the vibration disturbances introduced into the system due to cooling medium turbulences, in turn leading to reduced line-of-sight accuracy.

Hence, there is a desire to mechanically decouple far as possible the support of the optical elements used in the exposure process and the support of the auxiliary components of the metrology system and the cooling system from each other as well as from other internal and external vibration sources.

The increased size of the optical imaging apparatus and the multitude of auxiliary components lead to highly complex interleaved but mutually mechanically decoupled support structures. Such interleaved but decoupled support structures pose considerable problems during assembly of the optical imaging apparatus since the individual, ultimately mechanically decoupled components are held in a defined mutual position and orientation while, due to the interleaved arrangement, being hardly accessible for this purpose.

SUMMARY

The disclosure seeks to, at least to some extent, overcome the above disadvantages and to provide good and long term reliable imaging properties of an optical imaging apparatus used in an exposure process while allowing simple manufacture and assembly of the components of the optical imaging apparatus.

The disclosure seeks to reduce the effort for assembly of an optical imaging apparatus while at least maintaining the imaging accuracy of the optical imaging apparatus used in an exposure process.

According to one aspect, the disclosure is based on the technical teaching that an overall reduction of the effort for manufacture and assembly of the components of an optical imaging arrangement while at least maintaining the imaging accuracy of the optical imaging apparatus may be achieved if the primary, optical element support structure of the optical elements (executing the primary function of the exposure process) and the auxiliary support structure of the auxiliary components (executing auxiliary functions other than the primary function of the exposure process) are split into separate support sub-structures. The primary and auxiliary support sub-structures spatially (and eventually also functionally) associated to one or more individual optical elements can then be assembled as separate individual optical modules in a simple manner thanks to the improved accessibility of the individual components. After this individual optical module assembly the primary and auxiliary support sub-structures, ultimately to be held in a mechanically decoupled manner during the exposure process, are temporarily coupled and fixed in their mutual relative position and orientation using one or more temporary connecting devices.

By this approach, it is possible to assemble the optical imaging apparatus from one or more of these individual (pre-mounted and, eventually also pre-tested) individual optical modules by connecting the primary and auxiliary support sub-structures of the individual optical module to further primary and auxiliary support sub-structures, respectively, to form the respective primary and auxiliary support structure (configured to be mutually mechanically decoupled from each other). Once this is done, the temporary connection of the primary and auxiliary support sub-structures via the temporary connecting devices is simply released to achieve the mutually mechanically decoupled support via the primary and auxiliary support structures.

It will be appreciated that such a temporary connecting device may be placed at a location which is easily accessible even after assembly of the optical imaging apparatus. Hence, release of the temporary connecting device may ensue immediately after assembly of the optical imaging apparatus. In certain cases, one or more of these temporary connecting devices may remain operative over longer periods of time, e.g. during shipment of the assembled or pre-assembled optical imaging apparatus to its final destination.

It will be appreciated that, with the present disclosure, manufacture and assembly of the optical imaging apparatus may be greatly facilitated. This is due to the fact that the arbitrarily complex and/or interleaved design of the overall optical imaging apparatus may be split in separate considerably less complex and more easily manageable modules including primary and auxiliary support substructures temporarily fixed to each other via one or more easily accessible temporary connecting devices. These modules may then be simply assembled to ultimately form the respective primary and auxiliary support structures prior to releasing the temporary fixation.

It will be appreciated that any one of the further support sub-structures may form part of a further individual optical module. Hence, in some cases, the optical imaging apparatus may be formed exclusively by a plurality of such individual optical modules. However, with certain embodiments of the disclosure, such a further primary and/or auxiliary support substructure may be a separate individual support substructure, e.g. mounted to a base structure (typically via suitable vibration isolation in order to avoid transmission of structure borne vibration via the base structure).

It will be appreciated that, in the sense of the present disclosure, the individual optical imaging apparatus module does not necessarily have to contain an optical element and/or an auxiliary component. Rather, at least one of the optical imaging apparatus modules used may only contain the respective primary and/or auxiliary support substructures, the respective optical element and/or auxiliary component being mounted at a later point in time during assembly of the optical imaging apparatus, e.g. as a part of a further optical imaging apparatus module according to the present disclosure. With certain embodiments of the disclosure, however, the optical imaging apparatus module already includes the optical element and/or the auxiliary component.

It will be further appreciated that the (primary) optical element support substructure may support one or more optical elements. Furthermore, the auxiliary support substructure may support one or more auxiliary components. Furthermore, the optical imaging apparatus module may include auxiliary components of different types. Moreover, the optical imaging apparatus module may include a plurality of different auxiliary support substructures which, eventually, may also be mutually mechanically decoupled after assembly of the optical imaging apparatus, in particular during the exposure process.

Thus, according to a first aspect of the disclosure there is provided an optical imaging apparatus module for use in an optical imaging apparatus, in particular, for microlithography, including an optical element support sub-structure, and an auxiliary support sub-structure. The optical element support sub-structure is configured to support an optical element and has a first temporary support interface arrangement. The optical element is configured to form part of a group of optical elements of the optical imaging apparatus configured to transfer, in an exposure process using exposure light, an image of a pattern of a mask onto a substrate. The auxiliary support sub-structure is configured to support an auxiliary component and has a second temporary support interface arrangement, the auxiliary component being configured to execute, during the exposure process, an auxiliary function of the exposure process other than transferring the image of the pattern onto the substrate. The auxiliary component is configured to be, during the exposure process, spatially associated to the optical element and supported by an auxiliary support structure including the auxiliary support sub-structure in a manner mechanically decoupled from the optical element support sub-structure. The first temporary support interface arrangement and the second temporary support interface arrangement are configured to releasably cooperate with at least one temporary connecting device configured to temporarily support the auxiliary support sub-structure via the optical element support sub-structure at least during assembly of the optical imaging apparatus.

According to a second aspect of the disclosure there is provided a method of supporting components of an optical imaging apparatus module for use in an optical imaging apparatus, in particular, for microlithography. The method includes providing an optical element support sub-structure and an auxiliary support sub-structure, the optical element support sub-structure being configured to support an optical element forming part of a group of optical elements of the optical imaging apparatus configured to transfer, in an exposure process using exposure light, an image of a pattern of a mask onto a substrate, the auxiliary support sub-structure being configured to support an auxiliary component configured to execute, during the exposure process, an auxiliary function of the exposure process other than transferring the image of the pattern onto the substrate. The method further includes, in a first assembly step, releasably connecting the auxiliary support sub-structure and the optical element support sub-structure using at least one temporary connecting device to temporarily support the auxiliary support sub-structure via the optical element support sub-structure. The method further includes, in a second assembly step, connecting the optical element support sub-structure to a further optical element support sub-structure to support the optical element support sub-structure, and connecting the auxiliary support sub-structure to a further auxiliary support sub-structure to support the auxiliary support sub-structure. The method further includes, in a third assembly step, releasing the at least one temporary connecting device to support the auxiliary component via the auxiliary support sub-structure in a manner mechanically decoupled from the optical element support sub-structure.

It will be appreciated that the optical element support structure and the auxiliary support structure may be of arbitrarily complex interleaved design. Typically, the optical element support sub-structure is configured to surround, in a circumferential direction, the optical element such that the optical element, in a radial direction, is located inward of the optical element support sub-structure. The auxiliary component, in the radial direction, is located inward of the optical element support sub-structure. The optical element support sub-structure has a recess extending through the optical element support sub-structure in the radial direction. Preferably, the auxiliary support sub-structure, in the radial direction, is located in a vicinity of the recess and/or protrudes into the recess and/or protrudes through the recess. Furthermore, an interface component of the first temporary support interface arrangement and/or the second temporary support interface arrangement is located in a vicinity of the recess and/or is located at an outer side of the optical element support sub-structure. In all these cases, the temporary connecting device is easily accessible for later release of the temporary connecting device.

The temporary connecting device may be of any suitable design to provide sufficiently stable connection under any circumstances, in particular, any acceleration to be expected during normal handling and assembly of the respective optical imaging apparatus module. Preferably, a first interface component of the first temporary support interface arrangement and a second interface component of the second temporary support interface arrangement is configured to cooperate with a generally ring shaped and/or plate shaped temporary connecting device, the temporary connecting device, during assembly of the optical imaging apparatus, being temporarily connected to the optical element support sub-structure and the auxiliary support sub-structure in a vicinity of the recess. In addition or as an alternative, the temporary connecting device, during assembly of the optical imaging apparatus, may be temporarily connected to the auxiliary support sub-structure at an inner circumference of the generally ring shaped temporary connecting device.

The connection between the optical element support sub-structure and the auxiliary support substructure may be of any suitable type. Preferably, the first temporary support interface arrangement and the second temporary support interface arrangement is configured to cooperate with the least one temporary connecting device such that the auxiliary support sub-structure, during assembly of the optical imaging apparatus, is temporarily supported by the optical element support sub-structure in a statically determined manner (also referred to as isostatic manner). By this approach, a particularly favorable support avoiding the introduction of parasitic deformation achieved.

In addition or as alternative, the first temporary support interface arrangement and the second temporary support interface arrangement is configured to cooperate with a plurality of temporary connecting devices such that, during assembly of the optical imaging apparatus, at least one of the temporary connecting devices restricts motion between the auxiliary support sub-structure and the optical element support sub-structure in at least two degrees of freedom. With such a configuration particularly simple designs allowing an isostatic temporary mount may be achieved.

Basically, any desired releasable connecting techniques may be used (alone or in arbitrary combination) for the temporary connection. In any case, it is preferred to use connecting systems which involve as little frictional relative motion between the cooperating components as possible in order to avoid the generation of particles or debris prone to contaminate the optical system.

With certain preferred embodiments of the disclosure, an interface component of the first temporary support interface arrangement and/or the second temporary support interface arrangement is configured to cooperate with the at least one temporary connecting device in a positive connection. In addition or as alternative, an interface component of the first temporary support interface arrangement and/or the second temporary support interface arrangement may be configured to cooperate with the at least one temporary connecting device in a frictional connection. With certain preferred embodiments of the disclosure, an interface component of the first temporary support interface and/or the second temporary support interface forms a clamping interface, the clamping interface being configured to engage the at least one temporary connecting device in a clamping connection.

Mutual mechanically decoupled support of the optical element support substructure and the auxiliary support substructure may ensue in any suitable way. Preferably, the optical element support sub-structure has a third interface arrangement, the third interface arrangement being configured to cooperate with a fourth interface arrangement of a further optical element support sub-structure to support the optical element support sub-structure in a manner mechanically decoupled from the auxiliary support sub-structure after release of the at least one temporary connecting device. In addition or as an alternative, the auxiliary support sub-structure has a fifth interface arrangement, the fifth interface arrangement being configured to cooperate with a sixth interface arrangement of a further auxiliary support sub-structure to support the auxiliary support sub-structure in a manner mechanically decoupled from the optical element support sub-structure after release of the at least one temporary connecting device.

It will be appreciated that the optical element and/or the auxiliary component may be connected to the respective support substructure at any suitable point in time allowing easily establishing the respective connection.

As mentioned above, with preferred embodiments of the disclosure, the auxiliary component is already supported by the auxiliary support sub-structure prior to or after establishing the temporary connection via the temporary connecting device. Any type of auxiliary component may be chosen performing an auxiliary function for the exposure process at any point in time. It will be appreciated that such an auxiliary function does not necessarily have to be executed during the exposure process. For example, certain auxiliary functions may also be executed intermittently during subsequent steps of the exposure process.

With certain preferred embodiments of the disclosure, the auxiliary component is a component of a metrology arrangement used in the exposure process. It will be appreciated that this metrology component does not necessarily have to be functionally associated to the optical element. Rather, spatial association to the optical element may be sufficient. In particular, the respective metrology component may be functionally associated to a component of the optical imaging apparatus other than the spatially associated optical element.

Preferably, however, the auxiliary component is a component of a metrology arrangement associated to the optical element and configured to capture a variable representative of a state of the optical element. In this case, very compact and functionally highly integrated modules may be formed which, in particular, allow comprehensive pre-testing prior to assembly of the optical imaging apparatus.

With further preferred embodiments of the disclosure, the auxiliary component is a component of a temperature adjustment arrangement used for adjusting a temperature of a component of the optical imaging apparatus, in particular of the optical element, in particular, during the exposure process. Typically, such temperature adjustment arrangements include cooling devices. However, with other preferred embodiments of the disclosure, such temperature adjustment arrangements may also include active heating elements.

As mentioned above, the optical element is already supported by the optical element support sub-structure prior to or after establishing the temporary connection via the temporary connecting device. Generally, depending on the wavelength of the light used in the exposure process, any desired type of optical element (refractive, reflective or a diffractive) may be used alone or in arbitrary combination in the respective optical imaging apparatus module.

Furthermore, the present disclosure may be used for any type of optical imaging process using arbitrary wavelengths for the light used in the exposure process. Preferably, however, the exposure light has a wavelength in the EUV range, in particular, in the range from 5 nm to 20 nm, since in this case the advantages of the disclosure are particularly noticeable.

The present disclosure furthermore relates to an optical imaging arrangement including at least one optical imaging apparatus module according to the disclosure. In this case, the optical element support sub-structure may be connected to a further optical element support sub-structure to support the optical element support sub-structure in a manner mechanically decoupled from the auxiliary support sub-structure. In addition or as alternative, the auxiliary support sub-structure may be connected to a further auxiliary support sub-structure to support the auxiliary support sub-structure in a manner mechanically decoupled from the optical element support sub-structure.

It will be appreciated that mechanically decoupled support may ensue in any suitable way. Preferably, the further optical element support sub-structure and the further auxiliary support sub-structure are supported in a separately vibration isolated manner on a base support structure in a vibration isolation resonant frequency range, the isolation resonant frequency range ranging preferably from 0.8 Hz to 30 Hz. With certain embodiments of the present disclosure the isolation resonant frequency preferably ranges from 0.05 Hz to 8.0 Hz, preferably, from 0.1 Hz to 1.0 Hz, more preferably from 0.2 Hz to 0.6 Hz. Furthermore, with certain other embodiments of the present disclosure, the isolation resonant frequency preferably ranges from 8 Hz to 15 Hz or from 22 Hz to 30 Hz. By this approach, particularly effective mechanical decoupling may be achieved between the individual separate support structures.

With certain preferred embodiments of the disclosure, the further optical element support sub-structure is also configured to support a further optical element. To this end, the further optical element support sub-structure may form part of a further optical imaging apparatus module according to the disclosure. By this approach, very compact configurations may be achieved which are to manufacture, handle and assemble. Particularly favorable, structurally stable and relatively lightweight designs may be achieved if the further optical element support sub-structure is a substantially tray shaped component configured to receive the optical imaging apparatus module.

Further aspects and embodiments of the disclosure will become apparent from the dependent claims and the following description of preferred embodiments which refers to the appended figures. All combinations of the features disclosed, whether explicitly recited in the claims or not, are within the scope of the disclosure.

DETAILED DESCRIPTION OF THE DISCLOSURE

In the following, a preferred embodiment of an optical imaging arrangement 101 according to the disclosure with which a preferred embodiment of the method according to the disclosure may be executed will be described with reference to FIGS. 1 to 9. To facilitate understanding of the following explanations a xyz coordinate system is introduced in the Figures, wherein the z-direction designates the vertical direction (i.e. the direction of gravity).

Figure 1:
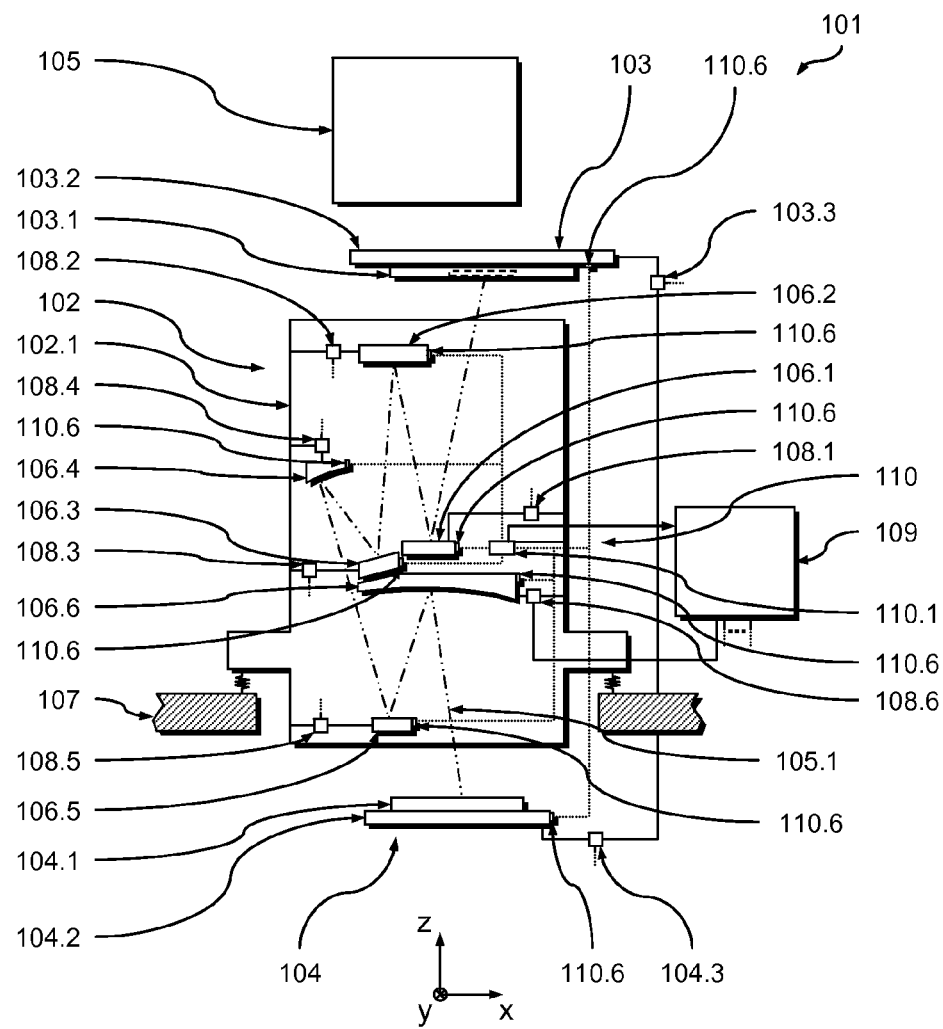
FIG. 1 is a schematic representation of a preferred embodiment of an optical imaging apparatus according to the disclosure with which a preferred embodiment of the method according to the present disclosure may be executed.

FIG. 1 is a highly schematic and not-to-scale representation of the optical imaging apparatus in the form of an optical exposure apparatus 101 operating in the EUV range at a wavelength of 13 nm. The optical exposure apparatus 101 includes an optical projection unit 102 adapted to transfer, as a primary function of the optical exposure apparatus 101, an image of a pattern formed on a mask 103.1 (located on a mask table 103.2 of a mask unit 103) onto a substrate 104.1 (located on a substrate table 104.2 of a substrate unit 104). To this end, the optical exposure apparatus 101 includes an illumination system 105 illuminating the reflective mask 103.1 via an appropriate light guide system (not shown). The optical projection unit 102 receives the light (represented by its chief ray 105.1) reflected from the mask 103.1 and projects the image of the pattern formed on the mask 103.1 onto the substrate 104.1, e.g. a wafer or the like.

To this end, the optical projection unit 102 holds an optical element unit group 106 of optical element units 106.1 to 106.6. This optical element unit group 106 is held within an optical element support structure 102.1. The optical element support structure 102.1 may take the form of a housing structure of the optical projection unit 102, which, in the following, is also referred to as the projection optics box structure (POB) 102.1. It will be appreciated, however, that this optical element support structure does not necessarily have to form a complete or even tight enclosure of the optical element unit group 106. Rather it may also be partially formed as an open structure as it is the case with the present example.

The projection optics box structure 102.1 is supported in a vibration isolated manner on a base structure 107 which also supports the mask table 103.2 via a mask table support device 103.3 and the substrate table 104.2 via a substrate table support device 104.3.

It will be appreciated that the projection optics box structure 102.1 may be supported in a cascaded manner via a plurality of vibration isolation devices and at least one intermediate support structure unit to achieve good vibration isolation. Generally, these vibration isolation devices may have different isolation frequencies to achieve good vibration isolation over a wide frequency range as will be explained in greater detail below.

The optical element unit group 106 includes a total of six optical element units, namely a first optical element unit 106.1, a second optical element unit 106.2, a third optical element unit 106.3, a fourth optical element unit 106.4, a fifth optical element unit 106.5 and a sixth optical element unit 106.6. In the present embodiment, each of the optical element units 106.1 to 106.6 consists of an optical element in the form of a mirror.

It will be appreciated however that, with other embodiments of the disclosure, the respective optical element unit may also include further components (beyond the optical element itself) such as, for example, aperture stops, holders or retainers holding the optical element and eventually forming an interface for the support unit connecting the optical element unit to the support structure.

It will be further appreciated that, with other embodiments of the disclosure, another number of optical element units may be used. Preferably, four to eight optical element units are provided.

Each one of the mirrors 106.1 to 106.6 is supported on the support structure formed by the projection optics box structure 102.1 by an associated support device 108.1 to 108.6. Each one of the support devices 108.1 to 108.6 is formed as an active device such that each of the mirrors 106.1 to 106.6 is actively supported at a defined control bandwidth.

It will be appreciated however that, with other embodiments of the disclosure, any other type of support devices may be selected for the respective mirror 106.1 to 106.6. In particular, passive support elements, semi-active (or intermittently active) support elements as well as active support elements may be used alone or in arbitrary combinations.

In the present example, the optical element unit 106.6 is a large and heavy component forming a first optical element unit of the optical element unit group 106 while the other optical element units 106.1 to 106.5 form a plurality of second optical element units of the optical element unit group 106. The first optical element unit 106.6 is actively supported at a low first control bandwidth, while the second optical element units 106.1 to 106.5 are actively supported at a second control bandwidth to substantially maintain a given spatial relationship of each of the second optical element units 106.1 to 106.5 with respect to the first optical element unit 106.6.

In the present example, a similar active support concept is chosen for the mask table support device 103.3 and the substrate table support device 104.3 both also actively supported at a third and fourth control bandwidth, respectively, to substantially maintain a given spatial relationship of the mask table 103.2 and the substrate table 104.2, respectively, with respect to the first optical element unit 106.6.

It will be appreciated however that, with other embodiments of the disclosure, another support concept or spatial adjustment concept, respectively, may be chosen for optical elements units 106.1 to 106.6 and/or the mask table 103.2 and/or the substrate table 104.2.

The image of the pattern formed on the mask 103.1 is usually reduced in size and transferred to several target areas of the substrate 104.1. The image of the pattern formed on the mask 103.1 may be transferred to the respective target area on the substrate 104.1 in two different ways depending on the design of the optical exposure apparatus 101. If the optical exposure apparatus 101 is designed as a so called wafer stepper apparatus, the entire image of the pattern is transferred to the respective target area on the substrate 104.1 in one single step by irradiating the entire pattern formed on the mask 103.1. If the optical exposure apparatus 101 is designed as a so called step-and-scan apparatus, the image of the pattern is transferred to the respective target area on the substrate 104.1 by progressively scanning the mask table 103.2 and thus the pattern formed on the mask 103.1 under the projection beam while performing a corresponding scanning movement of the substrate table 104.2 and, thus, of the substrate 104.1 at the same time.

In both cases, a given spatial relationship between the components participating in the exposure process (i.e. between the optical elements of the optical element unit group 106, i.e. the mirrors 106.1 to 106.6) with respect to each other as well as with respect to the mask 103.1 and with respect to the substrate 104.1 has to be maintained within predetermined limits to obtain a high quality imaging result.

During operation of the optical exposure apparatus 101, the relative position of the mirrors 106.1 to 106.6 with respect to each other as well as with respect to the mask 103.1 and the substrate 104.1 is subject to alterations resulting from, both, intrinsic and extrinsic, disturbances introduced into the system. Such disturbances may be mechanical disturbances, e.g. in the form vibrations resulting from forces generated within the system itself but also introduced via the surroundings of the system, e.g. the base support structure 107 (which itself is supported on a ground structure 111). They may also thermally induced disturbances, e.g. position alterations due to thermal expansion of the parts of the system.

In order to keep the above predetermined limits of the spatial relation of the mirrors 106.1 to 106.6 with respect to each other as well as with respect to the mask 103.1 and the substrate 104.1, each one of the mirrors 106.1 to 106.6 is actively positioned in space via their support devices 108.1 to 108.6, respectively. Similarly, the mask table 103.2 and the substrate table 104.2 are actively positioned in space via the respective support devices 103.3 and 104.3, respectively.

In the following, the control concept for the spatial adjustment of the components 106.1 to 106.6, 103.1 and 104.1 participating in the imaging process will be described with reference to FIGS. 1 and 2. As mentioned above, control of the adjustment of the components 106.1 to 106.6, 103.1 and 104.1 in all six degrees of freedom is done using the control unit 109 connected and providing corresponding control signals to each one of the support devices 108.1 to 108.6, 103.3 and 104.3 (as it is indicated in FIG. 1 by the solid and dotted lines at the control unit 109 and the respective support device) at a specific adjustment control bandwidth.

Figure 2:
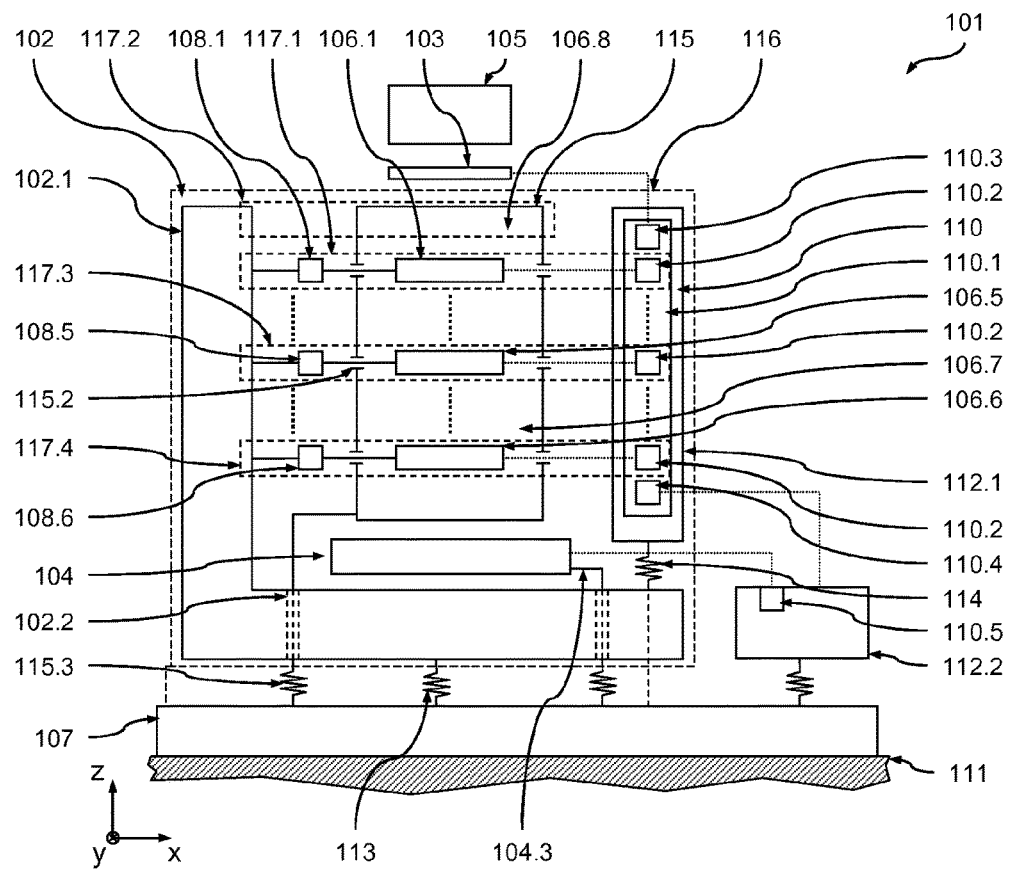
FIG. 2 is a further schematic representation of the optical imaging apparatus of FIG. 1.
Figure 3:
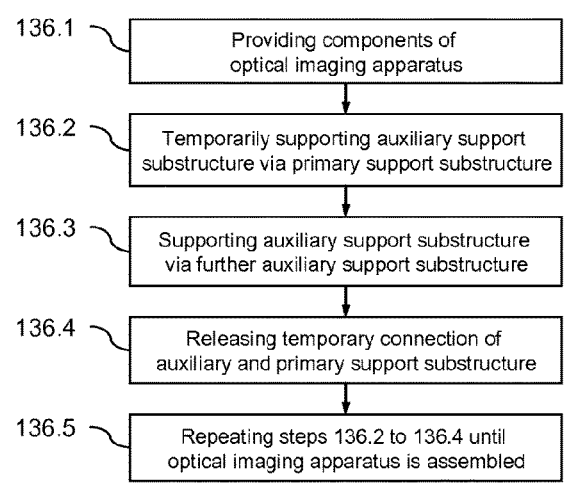
FIG. 3 is a block diagram of a preferred embodiment of a method of supporting components of an optical imaging apparatus module which may be executed with the optical imaging apparatus of FIG. 1.

The control unit 109 generates its control signals as a function of the metrology signals of the metrology arrangement 110 which, as an auxiliary function of the exposure process, captures the position and orientation of each one of the components 106.1 to 106.6, 103.1 and 104.1 in all six degrees of freedom (as it is indicated by the dotted lines in FIGS. 1 and 2). As mentioned above, the metrology arrangement 110 uses the large optical footprint sixth mirror 106.6 as an inertial reference (i.e. as a reference optical element unit) to which all further components 106.1 to 106.5, 103.1 and 104.1 participating in the imaging process are referred to. As can be seen from FIG. 1, the sixth mirror 106.6, in the light path, is the ultimate mirror unit hit last by the exposure light 105.1 when transferring the image of a pattern formed on the mask 103.1 onto the substrate 104.1.

To this end, the metrology arrangement uses a metrology unit 110.1 including a plurality of metrology devices 110.2, 110.3 and 110.4 mechanically connected to an auxiliary support structure in the form of a projection system metrology support structure 112.1 which in turn is supported by the projection optics box structure 102.1 as well as a metrology device 110.5 mechanically connected to a substrate system metrology support structure 112.2 as it is indicated in FIG. 1 (highly schematically) and FIG. 2. In the present embodiment, each metrology device 110.2, 110.3, 110.4 and 110.5 includes an auxiliary component in the form of a sensor head 110.7 connected to the projection system metrology support structure 112.1 or the substrate system metrology support structure 112.2, respectively, and cooperating with a reference element 110.6 mechanically connected directly to the respective mirror 106.1 to 106.6, the mask table support device 103.3, the substrate system metrology support structure 112.2 and the substrate table support device 104.3, respectively.

The term "mechanically connected directly", in the sense of the disclosure, is to be understood as a direct connection between two parts including (if any) a short distance between the parts allowing to reliably determine the position of the one part by measuring the position of the other part. In particular, the term may mean without the interposition of further parts introducing uncertainties in the position determination, e.g. due to thermal or vibration effects. It will be appreciated that, with certain embodiments of the disclosure, the reference element may not be a separate component connected to the mirror but may be directly or integrally formed on a surface of the mirror, e.g. as a grating or the like formed in a separate process upon manufacture of the mirror.

In the present embodiment, the metrology devices 110.2, 110.3, 110.4 and 110.5 operate according to an encoder principle, i.e. the sensor head emits a sensor light beam towards a structured surface and detects a reading light beam reflected from the structured surface of the reference element. The structured surface may be, for example, a grating including a series of parallel lines (one-dimensional grating) or a grid of mutually inclined lines (two-dimensional grating) etc. Positional alteration is basically captured from counting the lines passed by the sensor beam which may be derived from the signal achieved via the reading beam.

It will be appreciated however that, with other embodiments of the disclosure, apart from the encoder principle any other type of contactless measurement principle (such as e.g. an interferometric measurement principle, a capacitive measurement principle, an inductive measurement principle etc) may be used alone or in arbitrary combination. However, it will also be appreciated that, with other embodiments of the disclosure, any suitable contact based metrology arrangement may be used as well. As contact based working principles magnetostrictive or electrostrictive working principles etc may be used for example. In particular, the choice of the working principle may be made as a function of the desired accuracy properties.

The metrology device 110.2 associated to the sixth mirror 106.6 (in all six degrees of freedom) captures the first spatial relationship between the projection system metrology support structure 112 and the sixth mirror 106.6 which forms the inertial reference. Furthermore, the metrology devices 110.2, 110.3, 110.4 and 110.5 associated to the other components 106.1 to 106.5, 103.1 and 104.1 participating in the imaging process (in all six degrees of freedom) capture the spatial relationship between the projection system metrology support structure 112.1 and the associated component 106.1 to 106.5, 103.1 and 104.1.

In the case of the substrate 104.1 this is done in a cascaded manner (see FIG. 2) using the metrology device 110.4 mechanically connected to the projection system metrology support structure 112.1 (in combination with a reference element 110.6 mechanically connected directly to the substrate system metrology support structure 112.2) and the substrate system metrology device 110.5 mechanically connected to the substrate system metrology support structure 112.2 (in combination with a reference element 110.6 mechanically connected directly to the substrate table support device 104.3).

Finally, the metrology arrangement 110 determines the spatial relationship between the sixth mirror 106.6 and the respective further component 106.1 to 106.5, 103.1 and 104.1 using the first spatial relationship and the second spatial relationship. Corresponding metrology signals are then provided to the control unit 109 which in turn generates, as a function of these metrology signals, corresponding control signals for the respective support device 108.1 to 108.6, 103.3 and 104.3.

It will be appreciated that, with other embodiments of the disclosure, direct measurement of the spatial relation between the reference optical element (e.g. the sixth mirror) and any one of the respective further component (e.g. mirrors 106.1 to 106.5, mask 103.1 and substrate 104.1) participating in the imaging process may also be provided. Depending on the spatial boundary conditions an arbitrary combination of such direct and indirect measurements may also be used.

As mentioned above, to reduce the amount of vibration disturbance energy introduced into the projection optics box structure 102.1 (and, hence, into the projection system) and, ultimately, to reduce the adverse effects of such vibration disturbance energy, the projection optics box structure 102.1 is supported on the base support structure 107 via a first vibration isolation device 113. Similar applies to the projection system metrology support structure 112.1, which is supported on the projection optics box structure 102.1 (and, consequently, on the base support structure 107) via a second vibration isolation device 114, such that the projection system metrology support structure 112.1 is mechanically decoupled from the projection optics box structure 102.1.

It will be appreciated however that with other embodiments of the disclosure, the auxiliary support structure formed by the projection system metrology support structure 112.1 (instead of being supported on the projection optics box structure 102.1) may also be supported directly on the base support structure 107 via the second vibration isolation device 114 (as it is indicated in FIG. 2 by the dashed line), thereby achieving further mechanical decoupling from the projection optics box structure 102.1.

The substrate system metrology support structure 112.2 is supported on the base support structure 107 via a second vibration isolation device 114. By this support of the projection optics box structure 102.1 and the projection system metrology support structure 112.1 separate from the substrate system metrology support structure 112.2, the optical elements 106.1 to 106.6 as well as the metrology unit 110.1 are mechanically decoupled from the support 112.2 of sources of secondary internal vibration disturbances such as cooling circuits (not shown in greater detail) of the substrate system metrology support structure 112.2 (generating secondary vibration disturbances and releasing secondary vibration disturbance energy, respectively, due to the turbulent flow on the cooling medium).

It will be appreciated that, preferably, a similar approach is selected for the support of primary sources of vibration disturbance such as the substrate table support device 104.3 and the support of the mask table support device 103.3, which then is also supported on the base support structure 107 via a corresponding vibration isolation device (not shown in greater detail).

The first vibration isolation device 113 has a first vibration isolation resonant frequency of about 0.5 Hz, thereby achieving beneficial low pass vibration isolation at this location. It will be appreciated that, with other preferred embodiments of the disclosure, the first vibration isolation resonant frequency may be selected to be located in a range from 0.05 Hz to 8.0 Hz, a range from 0.1 Hz to 1.0 Hz, or a range from 0.2 Hz to 0.6 Hz. In any of these cases beneficial low pass vibration isolation is achieved. It will be appreciated that, with other preferred embodiments of the disclosure, the first vibration isolation resonant frequency may be selected to be located in a range from 0.05 Hz to 30 Hz. Furthermore, with certain embodiments of the present disclosure, the first vibration isolation resonant frequency preferably ranges from 8 Hz to 15 Hz or from 22 Hz to 30 Hz.

The second vibration isolation device 114 has a second vibration isolation resonant frequency of about 3 Hz. It will be further appreciated that, with the two-stage vibration isolated support of the projection system metrology support structure 112.1 on the base structure 107 (via the vibration isolation devices 114 and 113), at least a two-stage, in many cases even a three stage vibration isolation from primary sources of vibration disturbance (such as the as the substrate table support device 104.3 and the support of the mask table support device 103.3) and from secondary sources of vibration disturbance (such as the substrate system metrology support structure 112.2 and the internal cooling device 115 of the optical projection unit 102) is achieved.

In other words, on the one hand, structure borne primary and secondary vibration disturbance energy, in a beneficial way, is detoured via the base support structure 107 and the projection optics box structure 102.1 before reaching (if at all) the projection system metrology support structure 112.1, thereby beneficially increasing the length of the structural path the primary and secondary vibration disturbance would have to travel to reach the projection system metrology support structure 112.1 and, consequently, beneficially increasing attenuation of the primary and secondary vibration disturbance.

This ultimately leads to a particularly high vibration stabilization of the projection system metrology support structure 112.1 which is highly beneficial to the control performance of the system.

Figure 4:
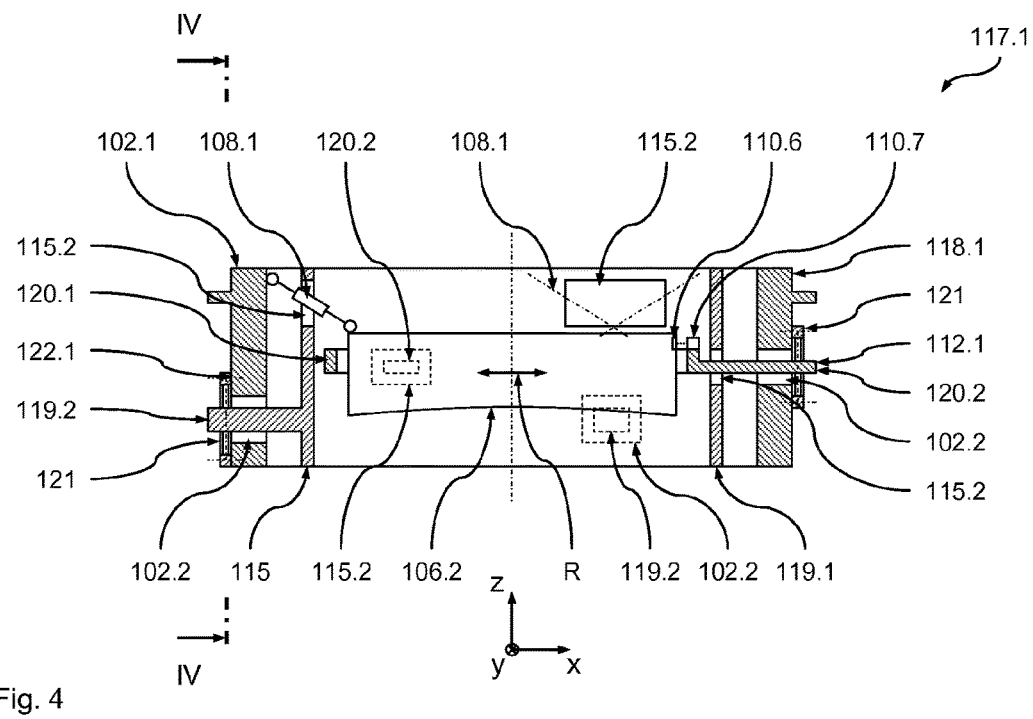
FIG. 4 is a schematic representation of a first embodiment of an optical imaging apparatus module according to the disclosure which may be used in the optical imaging apparatus of FIG. 1.

As can be seen from FIGS. 2 and 4, a similar support strategy is also chosen for a further auxiliary component in the form of an internal cooling device 115 of the optical projection unit 102, which also forms an internal secondary vibration disturbance source. The internal cooling device 115 includes an auxiliary support structure in the form of a sleeve 115.1 carrying corresponding cooling ducts (not shown in greater detail) and surrounding the optical elements 106.1 to 106.6 and parts of the metrology devices 110.2 (see FIG. 4). The internal cooling device 115 is designed such that has no immediate physical or structural contact with the optical elements 106.1 to 106.6, their associated support devices 108.1 to 108.6 and the projection optics box structure 102.1. Similar applies with respect to the components of the projection system metrology support structure 112.1.

The internal cooling device 115 only has immediate physical or structural contact with the base structure 107 via the internal cooling device support structure 115.1. In the present example, the internal cooling device support structure 115.1 is supported on the base support structure 107 via a further vibration isolation device 115.3. However, such a further vibration isolation device may also be omitted.

It will be appreciated that, one or more further cooling devices, in particular, external cooling devices surrounding the projection optics box structure 102.1, may be provided and supported on the base support structure 107 in a manner similar to the internal cooling device 115 (i.e. without immediate physical or structural contact with the optical elements 106.1 to 106.6, their associated support devices 108.1 to 108.6 and the projection optics box structure 102.1) as it is indicated in FIG. 2 by the dashed contour 116.

As can be seen, in particular, from FIGS. 2 and 4, to avoid such immediate physical or structural contact, the internal cooling device 115 has corresponding openings or recesses 115.2 through which the support devices 108.1 to 108.6, respectively, may reach without contacting the internal cooling device 115. Furthermore, the internal cooling device support structure 115.1 reaches through corresponding openings or recesses 102.2 provided within the projection optics box structure 102.1 without physically contacting the latter.

Hence, apparently, the primary support structure formed by the projection optics box structure 102.1 as well as the auxiliary support structures formed by the projection system metrology support structure 112.1 and the cooling device support structure 115.1 form a highly complex, interleaved and mutually penetrating system of mutually mechanically decoupled structures which poses considerable challenges during manufacture and assembly of the optical imaging apparatus 101.

To facilitate manufacture and assembly of the optical imaging apparatus 101, according to the present disclosure, the projection optics box structure 102.1, the projection system metrology support structure 112.1 and the cooling device support structure 115.1 are split into separate primary and auxiliary support sub-structures. The parts of the primary and auxiliary support sub-structures spatially and eventually also functionally associated to one another (in particular to one or more mirrors 106.1 to 106.6) are combined and assembled in separate and, eventually, also pre-tested individual optical imaging apparatus modules 117.1 to 117.4 prior to assembly of the optical imaging apparatus 101 as will be explained in greater detail below with reference to FIGS. 4 to 9.

As can be seen from FIG. 4, showing a first optical imaging apparatus module 117.1 in such a pre-assembled state, the first optical imaging apparatus module 117.1 includes mirror 106.2 which is supported via three support devices 108.1 by a generally ring-shaped force frame element 118.1 of the projection optics box structure 102.1 circumferentially surrounding mirror 106.2.

The three support devices 108.1, each being formed in the manner of a bipod, are substantially evenly distributed at the circumference of mirror 106.2, such that isostatic support in the manner of a hexapod is achieved. It will be appreciated, however, that with other embodiments of the disclosure any other desired type of support of mirror 106.2 may be realized.

As can be further seen from FIG. 4, the mirror 106.2 is surrounded by an auxiliary support sub-structure in the form of a generally ring-shaped cooler frame element 119.1 which forms part of the auxiliary cooling device support structure 115.1 and carries cooling ducts of the cooling device 115 (not shown in greater detail). In a radial direction R (defined by the mirror 106.2 and/or the ring-shaped force frame element 118.1) the cooler frame element 119.1 is located between the mirror 106.2 and the force frame element 118.1, i.e. radially inward of the force frame element 118.1.

Furthermore, the mirror 106.2 is surrounded by an auxiliary support sub-structure in the form of a generally ring-shaped metrology frame element 120.1 which forms part of the auxiliary projection system metrology support structure 112.1 and carries one or more sensor heads 110.7 of the metrology device 110. In the radial direction R, the metrology frame element 120.1 is located radially inward of the force frame element 118.1 between the mirror 106.2 and the force frame element 118.1 and the cooler frame element 119.1, respectively.

Both the cooler frame element 119.1 and the metrology frame element 120.1 are temporarily mounted to the force frame element 118.1 via temporary connecting devices 121. To this end, the cooler frame element 119.1 includes a plurality of radial protrusions 119.2 protruding laterally outward (in the radial direction R) through associated recesses 102.2 in the force frame element 118.1.

Similarly, the metrology frame element 120.1 includes a plurality of radial protrusions 120.2 protruding laterally outward (in the radial direction R) through associated recesses 115.2 in the cooler frame element 119.1 as well as associated recesses 102.2 in the force frame element 118.1.

In the present example, three radial protrusions 119.2 and three radial protrusions 120.2 are substantially evenly distributed along the circumference of the cooler frame element 119.1 and the metrology frame element 120.1, respectively. It will be appreciated however that, with other embodiments of the disclosure, any other number of radial protrusions and/or distribution of these radial protrusions may be selected. In particular, typically depending on the size and weight of the auxiliary support substructure, one single radial protrusion may be sufficient in either case.

To temporarily connect the force frame element 118.1 and the cooler frame element 119.2 via the temporary connecting device 121, the force frame element 118.1, at its outer side, has a first temporary support interface arrangement 122 including a first temporary support interface component 122.1 located in the area of each of the recesses 102.2 associated to the respective protrusion 119.2 of the cooler frame element 119.1.

Similarly, in the area of the protrusion 119.2 located adjacent to the first temporary support interface component 122.1, each protrusion 119.2 forms a second temporary support interface component 123.1 of the second temporary support interface arrangement 123 of the cooler frame element 119.1.

Figure 5:
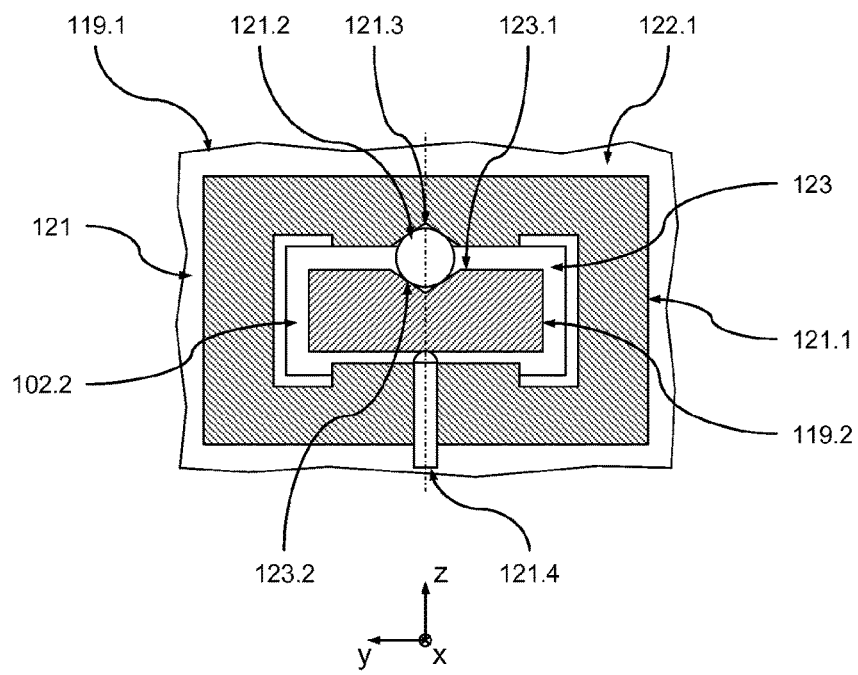
FIG. 5 is a schematic sectional representation of a detail of the optical imaging apparatus module of FIG. 4 (along line IV-IV of FIG. 4).

As can be seen from FIGS. 4 and 5, the temporary connecting device 121 includes a generally ring shaped and plate shaped connector element 121.1 connected to the force frame element 119.1 in the area of the first temporary support interface component 122.1 and connected to the cooler frame element 120.1 in the area of the second temporary support interface component 123.1. Hence, temporarily, the cooler frame element 119.1 is supported via the force frame element 118.1

It will be appreciated that either of these connections may be formed by any connecting technique (including a positive connection, a frictional connection and an adhesive connection, a monolithic connection or arbitrary combinations thereof). However, at least one of these connections is a releasable connection.

In the present example, as can be seen from FIG. 5, the temporary connecting device 121 includes a generally ball shaped first interface element 121.2 engaging a generally V-shaped recess 121.3 formed at the inner circumference of the connector element 121.1 and a generally V-shaped recess 123.2 formed on one (upper) side of the second temporary support interface component 123.1. An opposite (lower) side of the second temporary support interface component 123.1 is contacted by a generally hemispherical clamping head of a clamping screw element 121.4 engaging corresponding threads in the connector element 121.1.

To connect the force frame element 118.1 and the cooler frame element 119.1, the ball element 121.2 is inserted into the V-shaped recesses 121.3 and 123.2. Afterwards, clamping screw element 121.4 is very lightly tightened (basically only to ensure proper contact between the ball element 121.2 and the walls of the recesses 121.3 and 123.2), such that a combination of a slight clamping connection (i.e. a frictional connection) and a positive connection is formed between the force frame element 118.1 and the cooler frame element 119.1 substantially restricting motion in two degrees of freedom (DOF) only. Hence, a substantially isostatic mount is achieved via the three temporary connecting devices 121.

An identical connection is used to connect the force frame element 118.1 and the metrology frame element 120.1 via three temporary connecting devices 121, such that the metrology frame element 120.1 is also temporarily supported via the force frame element 118.1. Hence, reference is made here only to the explanations given above in this respect.

To release the respective connection via the temporary connecting devices 121 at a later point in time the clamping screw element 121.4 is released and the ball element 121.2 is removed such that a sufficient clearance is formed between the force frame element 118.1 and the cooler frame element 119.1 and the metrology frame element 120.1, respectively, ultimately supported in a mechanically decoupled manner via the projection optics box structure 102.1, the cooling device support structure 115.1 and the projection system metrology support structure 112.1, respectively.

It will be appreciated that the temporary connector element 121.1 may remain in place after release of the temporary connection. Hence, it is to be noted that, with certain embodiments of the disclosure, the temporary connector element 121.1 may also be formed monolithically with the force frame element 118.1. However, with certain other embodiments of the disclosure, the temporary connector element 121.1 may also be removed from the force frame element 118.1.

It will be further appreciated that by this temporary connection via the temporary connecting devices 121, manufacture, handling and assembly of the optical imaging apparatus module 117.1 is greatly facilitated despite the complex and interleaved design of the individual support substructures 118.1, 119.1 and 120.1. In particular, handling of the entire optical imaging apparatus module 117.1 may simply ensue via corresponding handling forces exerted on the force frame element 118.1.

Moreover, since the respective support substructures 118.1, 119.1 and 120.1 may be temporarily fixed within certain predefined tolerances (as regards their mutual relative position and orientation) with respect to their final position and orientation to be achieved during the exposure process, the optical imaging apparatus module 117.1 may be pre-tested prior to assembly of the optical imaging apparatus 101.

It will be further appreciated that, with other embodiments of the disclosure, any other suitable type of connection may be chosen via the temporary connecting devices 121. In particular, it is preferred to realize a connection which involves as little frictional motion between components of the arrangement as possible in order to avoid generation of particles or debris which might otherwise contaminate the optical system. It will be appreciated that, in particular, and active solution may be implemented wherein, for example, actuator elements (e.g. piezoelectric actuators or the like) generate or release a holding force (typically a clamping force) exerted between the components of the temporary connecting arrangement.

Figure 6:
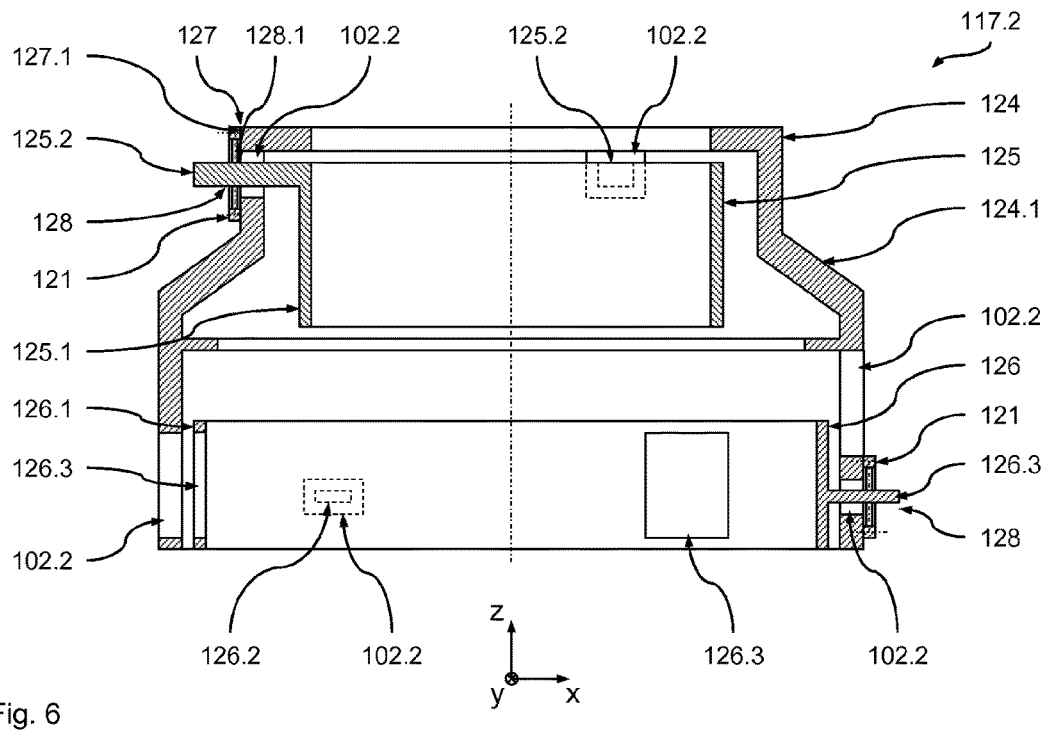
FIG. 6 is a schematic representation of a second embodiment of an optical imaging apparatus module according to the disclosure which may be used in the optical imaging apparatus of FIG. 1.

FIG. 6 shows a schematic sectional representation of a further optical imaging apparatus module according to the present disclosure in the form of the second optical imaging apparatus module 117.2. The optical imaging apparatus module 117.2 is shown in a pre-assembled state wherein it includes a generally tray-shaped force frame element 124.1 forming a top part of the projection optics box structure 102.1.

An auxiliary support sub-structure in the form of a generally ring-shaped cooler frame element 125.1 is located radially inward (in a radial direction R defined by the tray-shaped force frame element 124.1) of the force frame element 124.1 and forms part of the auxiliary cooling device support structure 115.1 carrying cooling ducts (not shown in greater detail) of the cooling device 115.

Furthermore, the force frame element 124.1 receives an auxiliary support sub-structure in the form of a generally ring-shaped metrology frame element 126.1 which forms part of the auxiliary projection system metrology support structure 112.1. In the radial direction R, the metrology frame element 126.1 is also located radially inward of the force frame element 124.1.

Both the cooler frame element 125.1 and the metrology frame element 126.1 are temporarily mounted to the force frame element 124.1 via temporary connecting devices 121 in the same manner as it has been described above in the context of the corresponding components (119.1 and 120.1)

of the first optical imaging apparatus module 117.1. Hence, explicit reference is made to the explanations given above.

Again, the cooler frame element 125.1 includes a plurality of radial protrusions 125.2 protruding laterally outward (in the radial direction R) through associated recesses 102.2 in the force frame element 124.1. Similarly, the metrology frame element 126.1 includes a plurality of radial protrusions 126.2 protruding laterally outward (in the radial direction R) through associated recesses 102.2 in the force frame element 124.1.

Again, in the present example, three radial protrusions 125.2 and three radial protrusions 126.2 are substantially evenly distributed along the circumference of the cooler frame element 125.1 and the metrology frame element 126.1, respectively. It will be appreciated however that, with other embodiments of the disclosure, any other number of radial protrusions and/or distribution of these radial protrusions may be selected. In particular, typically depending on the size and weight of the auxiliary support substructure, one single radial protrusion may be sufficient in either case.

To releasably and temporarily connect the force frame element 124.1 and the cooler frame element 125.2 via the temporary connecting device 121, the force frame element 124.1, at its outer side, has a first temporary support interface arrangement 127 including a first temporary support interface component 127.1 located in the area of each of the recesses 102.2 associated to the respective protrusion 125.2 of the cooler frame element 125.1. Similarly, in the area of the protrusion 125.2 located adjacent to the first temporary support interface component 127.1, each protrusion 125.2 forms a second temporary support interface component 128.1 of the second temporary support interface arrangement 128 of the cooler frame element 125.1.

The temporary connecting device 121 is designed and the same manner as it has been described in the context of FIG. 5. Hence, explicit reference is made to the explanations given above.

An identical releasable connection is used to connect the force frame element 124.1 and the metrology frame element 126.1 via three temporary connecting devices 121, such that the metrology frame element 126.1 is also temporarily supported via the force frame element 124.1. Hence, reference is made here only to the explanations given above in this respect.

Here as well, due to the temporary connection via the temporary connecting devices 121, manufacture, handling and assembly of the optical imaging apparatus module 117.2 is greatly facilitated despite the complex and interleaved design of the individual support substructures 124.1, 125.1 and 126.1. In particular, handling of the entire optical imaging apparatus module 117.2 may simply ensue via corresponding handling forces exerted on the force frame element 124.1.

Moreover, since the respective support substructures 124.1, 125.1 and 126.1 may be temporarily fixed within certain predefined tolerances (as regards their mutual relative position and orientation) with respect to their final position and orientation to be achieved during the exposure process, the optical imaging apparatus module 117.2 may be pre-tested prior to assembly of the optical imaging apparatus 101 in case, for example, the metrology frame element 126.1 supports itself components of the metrology arrangement.

It will be appreciated that the optical imaging apparatus module 117.2, in its preassembled state as shown in FIG. 6, does not hold any of the optical elements 106.1 to 106.6 rather it is a preassembled module including substructures of the projection optics box structure 102.1, the projection system metrology support structure 112.1 and the cooling device support structure 115.1 providing interfaces for the corresponding support substructures of the first optical imaging apparatus module 117.1.

Figure 7:
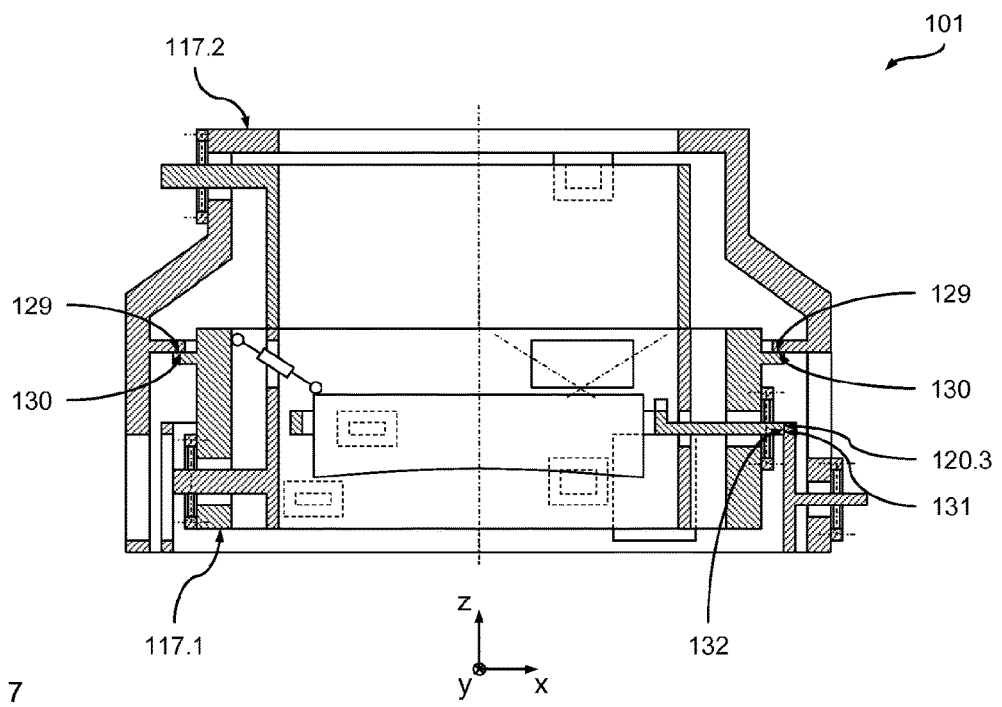
FIG. 7 is a schematic representation of the assembled combination of the optical imaging apparatus modules of FIGS. 4 and 6 in a first state.

Hence, as can be seen from FIG. 7, in a certain assembly state of the optical imaging apparatus 101, the first optical imaging apparatus module 117.1 is inserted into the second imaging apparatus module 117.2. Once this is done the force frame element 118.1 and the force frame element 124.1 are connected (using arbitrary connection techniques, in particular, alone or in arbitrary combination, a frictional connection, a positive connection or an adhesive connection) at a third interface arrangement 129 of the force frame element 118.1 and a fourth interface arrangement 130 of the force frame element 124.1, such that the first optical imaging apparatus module 117.1 is now supported by the force frame element 124.1 of the second optical imaging apparatus module 117.2.

Once this connection between the force frame element 118.1 and the force frame element 124.1 is completed, a fifth interface arrangement 131 form at the respective free end 120.3 of the protrusions 120.2 of the metrology frame element 120.1 is firmly mechanically connected to a corresponding adjacent sixth interface arrangement 132 of the metrology frame element 126.1.

It will be appreciated that this connection is made in a manner which is as far as possible free from pre-stresses to the connected components. To this end, for example suitable mechanisms (such as spacers etc.) may be used to compensate for tolerances within the metrology frame elements 120.1 and 126.1 to be connected.

Similar applies to the cooler frame elements 119.1 and 125.1, which are also mechanically connected at their mutual adjacent interfaces.

Figure 8:
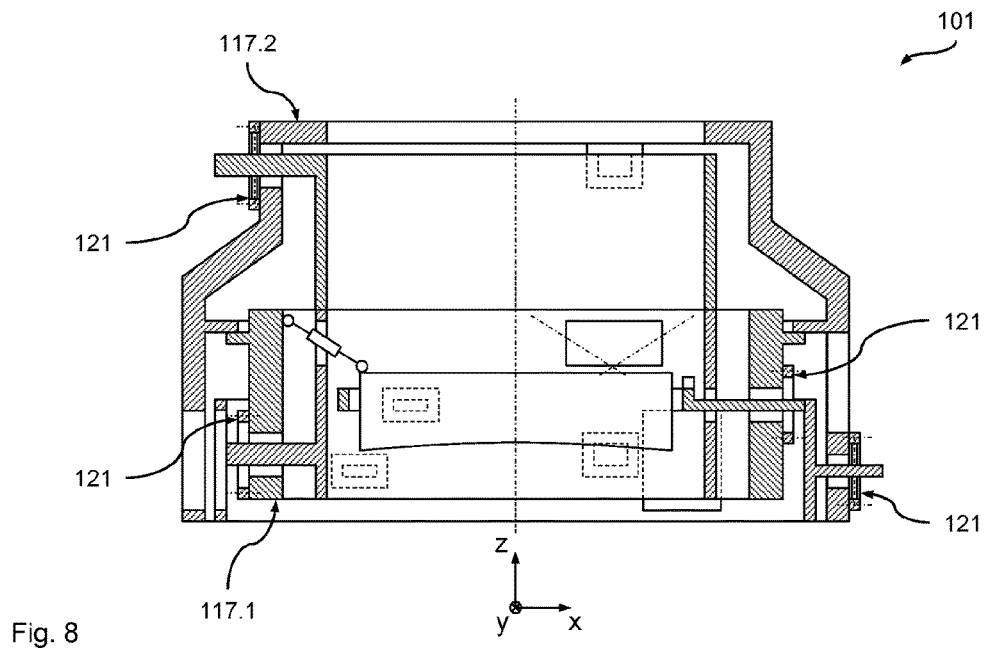
FIG. 8 is a schematic representation of the assembled combination of the optical imaging apparatus modules of FIGS. 4 and 6 in a second state.

Once a sufficiently firm mechanical connection is obtained between the metrology frame elements 120.1 and 126.1 and the cooler frame elements 119.1 and 125.1, the easily accessible temporary connecting devices 121 are released (as it is shown in FIG. 8, such that the metrology frame element 120.1 is now supported by the metrology frame element 126.1 of the second optical imaging apparatus module 117.2 and the cooler frame element 119.1 is now supported by the cooler frame element 125.1 of the second optical imaging apparatus module 117.2, while both have no immediate mechanical connection with the force frame element 118.1 anymore.

Finally, the force frame element 124.1 of the second optical imaging apparatus module 117.1 is connected to a further force frame element 133.1 of the third optical imaging apparatus module 117.3. The further force frame element 133.1, eventually after adding further optical imaging apparatus modules in the same way as has been described above, is ultimately supported on the base structure 107 via the vibration isolation device 113 as it is schematically indicated in FIG. 9.

Figure 9:
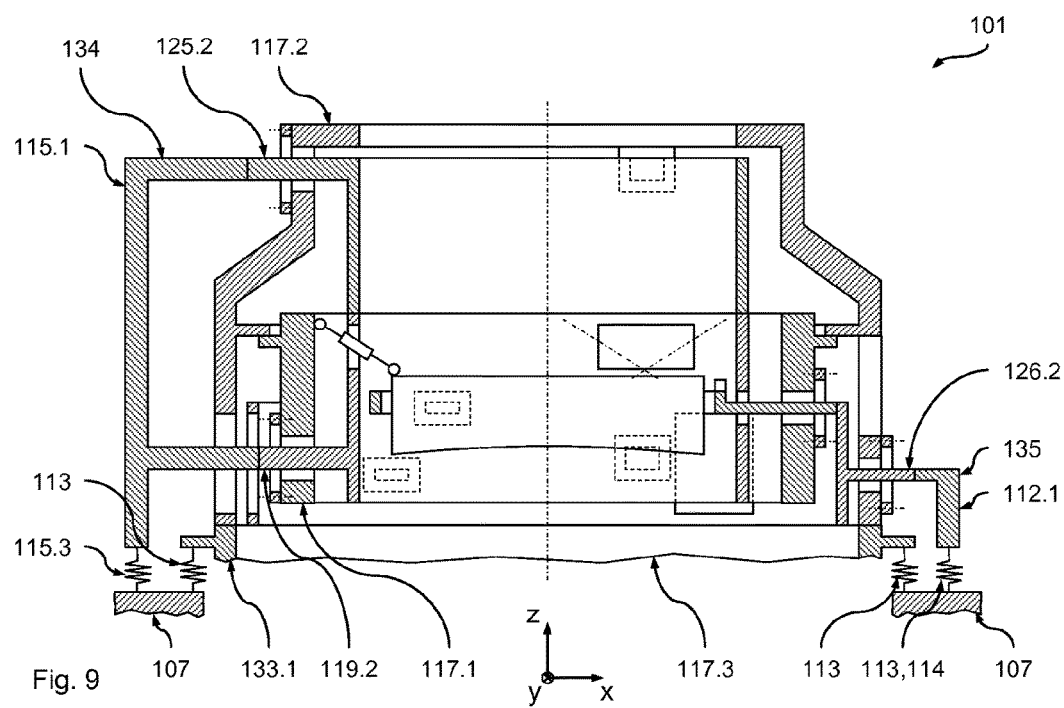
FIG. 9 is a schematic representation of the assembled combination of the optical imaging apparatus modules of FIGS. 4 and 6 in a third state.

Similarly, the protrusions 119.2 and 125.2 of the cooler frame elements 119.1 and 125.1 are connected via corresponding interfaces at their free ends to a further cooler frame element 134 of the cooling device support structure 115.1 (extending through openings 102.2 and 126.3, respectively), which is ultimately supported on the base structure 107 in a vibration isolated manner via the third vibration isolation device 115.3 as it is schematically indicated in FIG. 9.

Furthermore, similarly, the protrusions 126.2 of the metrology frame element 126.1 are connected via corresponding interfaces at their free ends to a further metrology frame element 135 of the projection system metrology support structure 112.1, which is ultimately supported on the base structure 107 in a (cascaded or non-cascaded) vibration isolated manner via the first and second vibration isolation device 113, 114 as it is also schematically indicated in FIG. 9.

Once a sufficiently firm mechanical connection is obtained between the cooler frame elements 119.1, 125.1 and 134 as well as between the metrology frame elements 126.1 and 135, the easily accessible temporary connecting devices 121 are released (as it is shown in FIG. 9, such that the metrology frame elements 120.1 and 126.1 are now supported by the metrology frame element 135 and the cooler frame elements 119.1, 125.1 are now supported by the cooler frame element 134 in a manner mechanically decoupled from the force frame elements 118.1, 124.1, 133.1.

It will be appreciated that the entire optical projection system 102 may be assembled in the way outlined above in a comparatively simple way despite the complex interleaved and mutually penetrating but mutually mechanically decoupled support structures 102.1, 112.1 and 115.1. This greatly facilitates manufacture, handling and assembly of the components of the optical projection system 102. In particular, as outlined above, the components of the optical projection system provided in separate optical imaging apparatus modules 117.1 to 117.4 including components of the primary optical system and components one or more auxiliary systems spatially and eventually functionally associated to the respective components of the primary optical system may be easily pretested prior to assembly of the optical projection system 102, which greatly facilitates and speeds up assembly of the optical projection system 102.

It will be appreciated that any desired and appropriate material may be selected for the respective support structure. For example, metals like aluminum may be used for the respective support structure, in particular, for support structures involving a comparatively high rigidity at a comparatively low weight. It will be appreciated that the material for the support structures is preferably selected depending on the type or function of the support structure.

In particular, for the projection optics box structure 102.1 steel, aluminum (Al), titanium (Ti), so called Invar-alloys (i.e. iron nickel alloys with 33% to 36% of Ni, e.g. Fe64Ni36) and appropriate tungsten alloys (such as e.g. DENSIMET® and INERMET® composite materials, i.e. heavy metals with a tungsten content greater than 90% and a NiFe or NiCu binder phase) are preferably used.

Furthermore, for the projection system metrology support structure 112.1 materials such as silicon infiltrated silicon carbide (SiSiC), silicon carbide (SiC), silicon (Si), carbon fiber reinforced silicon carbide (C/CSiC), aluminum oxide ($Al_2O_3$), Zerodur® (a lithium aluminosilicate glass-ceramic), ULE® glass (a titania silicate glass), quartz, Cordierite (a magnesium iron aluminium cyclosilicate) or another ceramic material with low coefficient of thermal expansion and high modulus of elasticity may also be beneficially used.

It will be appreciated that, with the microlithography apparatus 101 of the present embodiment, a line of sight accuracy may be obtained which is below 100 pm in all the relevant degrees of freedom, typically in the x direction and the y direction.

With the optical imaging apparatus 101 of FIGS. 1, 2 and 4 to 9 a method of supporting components of an optical imaging apparatus module according to the disclosure may be executed as it will be described in the following with reference to FIGS. 1 to 9.

First, in a step 136.1, the components of the optical imaging apparatus 101 as they have been described above are provided Furthermore, in a first assembly step 136.2, each one of the cooler frame element 119.1 and the metrology frame element 120.1 is connected to the force frame element 118.1 of the first optical imaging apparatus module 117.1 using the temporary connecting devices 121 to temporarily support the cooler frame element 119.1 and the metrology frame element 120.1, respectively, via the force frame element 118.1 as it has been outlined above in the context of FIG. 4. Similar first assembly steps are also executed for all further optical imaging apparatus modules 117.2 to 117.4.

In a second assembly step 136.3, the force frame element 118.1 of module 117.1 is connected to the force frame element 124.1 of module 117.2, while the cooler frame element 119.1 of module 117.1 is connected to the cooler frame element 125.1 of module 117.2 and the metrology frame element 120.1 of module 117.1 is connected to the metrology frame element 126.1 of module 117.2 as it has been outlined above in the context of FIG. 7.

In a third assembly step 136.4, the temporary connections via the temporary connecting devices 121 between the force frame element 118.1 of module 117.1 and the cooler frame element 119.1 as well as the metrology frame element 120.1 of module 117.1 are released as has been described above in the context of FIG. 8.

Finally, in a step 136.5, the first to third assembly steps 136.2 to 136.4 are repeated for all further optical imaging apparatus modules 117.3 to 117.4 to be added until the entire optical projection system 102 is fully assembled and the projection optics box structure 102.1, the projection system metrology support structure 112.1 and the cooling device support structure 115.1 are fully formed and supported in a mutually mechanically decoupled way as it has been described above.

Although, in the foregoing, embodiments of the disclosure have been described where the optical elements are exclusively reflective elements, it will be appreciated that, with other embodiments of the disclosure, reflective, refractive or diffractive elements or any combinations thereof may be used for the optical elements of the optical element units.

What is claimed is:

1. An optical imaging apparatus module, comprising:
   an optical element support sub-structure configured to support an optical element and having a first temporary support interface arrangement; and
   an auxiliary support sub-structure configured to support an auxiliary component and having a second temporary support interface arrangement,
   wherein:
   the optical element is configured to define part of a group of optical elements of an optical imaging apparatus configured to transfer, during an exposure process, an image of a pattern of a mask onto a substrate;
   the auxiliary component is configured to execute, during the exposure process, an auxiliary function of the exposure process other than to transfer the image of the pattern onto the substrate;
   the auxiliary component is configured to be, during the exposure process, spatially associated with the optical element and supported by an auxiliary support structure comprising the auxiliary support sub-structure in a manner mechanically decoupled from the optical element support sub-structure; and the first and second temporary support interface arrangements are configured to releasably cooperate with a temporary connecting device configured to temporarily support the auxiliary support sub-structure via the optical element support sub-structure at least during assembly of the optical imaging apparatus.

2. The optical imaging apparatus module of claim 1, wherein:
the optical element support sub-structure is configured to surround the optical element in a circumferential direction so that that the optical element is located inward of the optical element support sub-structure in a radial direction;
in the radial direction, the auxiliary component is located inward of the optical element support sub-structure;
the optical element support sub-structure has a recess extending through the optical element support sub-structure in the radial direction;
in the radial direction, the auxiliary support sub-structure is located in a vicinity of the recess and/or protruding into the recess and/or protruding through the recess; and
an interface component of the first temporary support interface arrangement and/or the second temporary support interface arrangement is located in a vicinity of the recess and/or is located at an outer side of the optical element support sub-structure.

3. The optical imaging apparatus module of claim 2, wherein:
a first interface component of the first temporary support interface arrangement and a second interface component of the second temporary support interface arrangement are configured to cooperate with a generally ring shaped and/or plate shaped temporary connecting device; and
at least one of the following holds:
during assembly of the optical imaging apparatus, the temporary connecting device is temporarily connected to the optical element support sub-structure and the auxiliary support sub-structure in a vicinity of the recess; and
during assembly of the optical imaging apparatus, the temporary connecting device is temporarily connected to the auxiliary support sub-structure at an inner circumference of the generally ring shaped temporary connecting device.

4. The optical imaging apparatus module of claim 1, wherein:
the first and second temporary support interface arrangements are configured to cooperate with the temporary connecting device so that the auxiliary support sub-structure is temporarily supported by the optical element support sub-structure isostatically; and/or
the first and second temporary support interface arrangements are configured to cooperate with a plurality of temporary connecting devices so that at least one of the temporary connecting devices restricts motion between the auxiliary support sub-structure and the optical element support sub-structure in at least two degrees of freedom, during assembly of the optical imaging apparatus.

5. The optical imaging apparatus module of claim 1, wherein at least one of the following holds:
an interface component of the first temporary support interface arrangement and/or the second temporary support interface arrangement is configured to cooperate with the temporary connecting device in a positive connection; and
an interface component of the first temporary support interface arrangement and/or the second temporary support interface arrangement is configured to cooperate with the temporary connecting device in a frictional connection.

6. The optical imaging apparatus module of claim 5, wherein an interface component of the first temporary support interface and/or the second temporary support interface defines a clamping interface configured to engage the temporary connecting device in a clamping connection.

7. The optical imaging apparatus module of claim 1, wherein at least one of the following holds:
the optical element support sub-structure has a third interface arrangement configured to cooperate with a fourth interface arrangement of a further optical element support sub-structure to support the optical element support sub-structure in a manner mechanically decoupled from the auxiliary support sub-structure after release of the temporary connecting device; and
the auxiliary support sub-structure has a fifth interface arrangement configured to cooperate with a sixth interface arrangement of a further auxiliary support sub-structure to support the auxiliary support sub-structure in a manner mechanically decoupled from the optical element support sub-structure after release of the temporary connecting device.

8. The optical imaging apparatus module of claim 1, wherein at least one of the following holds:
the auxiliary component is supported by the auxiliary support sub-structure;
the auxiliary component is a component of a metrology arrangement configured to be used in the exposure process;
the auxiliary component is a component of a metrology arrangement associated with the optical element and configured to capture a variable representative of a state of the optical element; and
the auxiliary component is a component of a temperature adjustment arrangement configured to be used to adjust a temperature of a component of the optical imaging apparatus.

9. The optical imaging apparatus module of claim 1, wherein at least one of the following holds:
the optical element is supported by the optical element support sub-structure;
the optical element comprises a reflective element; and
the exposure light has a wavelength in the EUV range.

10. An apparatus, comprising:
an optical imaging apparatus module according to claim 1,
wherein the apparatus is an optical imaging apparatus.

11. The optical imaging apparatus according to claim 10, wherein at least one of the following holds:
the optical element support sub-structure is connected to a further optical element support sub-structure to support the optical element support sub-structure in a manner mechanically decoupled from the auxiliary support sub-structure; and
the auxiliary support sub-structure is connected to a further auxiliary support sub-structure to support the auxiliary support sub-structure in a manner mechanically decoupled from the optical element support sub-structure.

12. The optical imaging apparatus according to claim 11, wherein at least one of the following holds:
   the further optical element support sub-structure and the further auxiliary support sub-structure are supported in a separately vibration isolated manner on a base support structure in a vibration isolation resonant frequency range ranging from 0.05 Hz to 30 Hz;
   the further optical element support sub-structure is configured to support a further optical element;
   the further optical element support sub-structure is a substantially tray shaped component configured to receive the optical module; and
   the further optical element support sub-structure defines part of a further optical imaging apparatus module.

13. A method of supporting components of an optical imaging apparatus comprising an optical element support sub-structure and an auxiliary support sub-structure, the optical element support sub-structure configured to support an optical element defining part of a group of optical elements of the optical imaging apparatus configured to transfer an image of a pattern of a mask onto a substrate during an exposure process using exposure light, the auxiliary support sub-structure configured to support an auxiliary component configured to execute an auxiliary function of the exposure process other than transferring the image of the pattern onto the substrate during the exposure process, the method comprising:
   a) releasably connecting the auxiliary support sub-structure and the optical element support sub-structure using a temporary connecting device to temporarily support the auxiliary support sub-structure via the optical element support sub-structure;
   b) connecting the optical element support sub-structure to a further optical element support sub-structure to support the optical element support sub-structure, and connecting the auxiliary support sub-structure to a further auxiliary support sub-structure to support the auxiliary support sub-structure; and
   c) releasing the temporary connecting device to support the auxiliary component via the auxiliary support sub-structure in a manner mechanically decoupled from the optical element support sub-structure.

14. The method of claim 13, wherein:
   providing the optical element support sub-structure comprises: configuring the optical element support sub-structure to surround the optical element in a circumferential direction so that the optical element is located inward of the optical element support sub-structure in a radial direction; and forming a recess extending through the optical element support sub-structure in the radial direction;
   in the radial direction, the auxiliary component is located inward of the optical element support sub-structure so that, in the radial direction, the auxiliary support sub-structure is located in a vicinity of the recess and/or protrudes into the recess and/or protrudes through the recess; and
   temporarily connecting the auxiliary support sub-structure and the optical element support sub-structure via the temporary connecting device in a vicinity of the recess and/or at an outer side of the optical element support sub-structure.

15. The method of claim 14, wherein:
   the auxiliary support sub-structure and the optical element support sub-structure are temporarily connected via a generally ring shaped and/or plate shaped temporary connecting device; and
   at least one of the following holds:
      the temporary connecting device is temporarily connected to the optical element support sub-structure and the auxiliary support sub-structure in a vicinity of the recess; and
      the temporary connecting device is temporarily connected to the auxiliary support sub-structure at an inner circumference of the generally ring shaped temporary connecting device.

16. The method of claim 13, wherein at least one of the following holds:
   during a) and b), the auxiliary support sub-structure is temporarily supported by the optical element support sub-structure in a statically determined manner; and
   a plurality of temporary connecting devices is used such that, during a) and b), the temporary connecting device restricts motion between the auxiliary support sub-structure and the optical element support sub-structure in at least two degrees of freedom.

17. The method of claim 13, wherein the optical element support sub-structure and/or the auxiliary support sub-structure is connected to the temporary connecting device in a positive connection, a frictional connection and/or a clamping connection.

18. The method of claim 13, wherein at least one of the following holds:
   the auxiliary component is a component of a metrology arrangement configured to be used in the exposure process;
   the auxiliary component is a component of a metrology arrangement associated with the optical element and configured to capture a variable representative of a state of the optical element; and
   the auxiliary component is a component of a temperature adjustment arrangement configured to be used to adjust a temperature of a component of the optical imaging apparatus, in particular of the optical element.

19. The method of claim 13, wherein at least one of the following holds:
   the optical element is supported by the optical element support sub-structure;
   the optical element comprises a reflective element; and
   the exposure light has a wavelength in the EUV range, in particular, in the range from 5 nm to 20 nm.

20. The method of claim 13, wherein at least one of the following holds:
   the further optical element support sub-structure and the further auxiliary support sub-structure are supported in a separately vibration isolated manner on a base support structure in a vibration isolation resonant frequency range ranging from 0.05 Hz to 30 Hz;
   the further optical element support sub-structure supports a further optical element; and
   the further optical element support sub-structure is a substantially tray shaped component receiving the optical module; and
   the further optical element support sub-structure defines part of a further optical imaging apparatus module.

* * * * *

UNITED STATES PATENT AND TRADEMARK OFFICE
CERTIFICATE OF CORRECTION

| | | |
|---|---|---|
| PATENT NO. | : 9,804,500 B2 | Page 1 of 1 |
| APPLICATION NO. | : 15/057491 | |
| DATED | : October 31, 2017 | |
| INVENTOR(S) | : Jens Kugler, Stefan Xalter and Jens Prochnau | |

It is certified that error appears in the above-identified patent and that said Letters Patent is hereby corrected as shown below:

On the Title Page

Column 1, Line 1 of "Applicant", delete "Oberkcohen" and insert -- Oberkochen --.

In the Specification

Column 9, Line 29, delete "FIG. 4)." and insert -- FIG. 4); --.

Column 17, Line 20, after "118.1", insert -- . --.

Column 22, Line 3, after "provided", insert -- . --.

In the Claims

Column 23, Line 12, Claim 2, delete "that that" and insert -- that --.

Signed and Sealed this
Twenty-sixth Day of December, 2017

Joseph Matal
*Performing the Functions and Duties of the*
*Under Secretary of Commerce for Intellectual Property and*
*Director of the United States Patent and Trademark Office*